United States Patent [19]

Pye

[11] 3,824,473

[45] July 16, 1974

[54] TRF RADIO RECEIVER WITH ENHANCED Q AERIAL TUNED CIRCUIT AND FREQUENCY RESPONSE COMPENSATION IN THE LOW FREQUENCY AMPLIFIER

[75] Inventor: Michael Richard Pye, Carlton, England

[73] Assignee: Texas Instruments Incorporated, Dallas, Tex.

[22] Filed: Nov. 16, 1972

[21] Appl. No.: 307,303

[30] Foreign Application Priority Data

Dec. 9, 1971 Great Britain .................... 57309/71

[52] U.S. Cl. ................. 325/375, 325/383, 325/385, 325/387, 330/38 M

[51] Int. Cl. ............................................. H04b 1/16

[58] Field of Search ............ 325/373, 374, 383–385, 325/387, 428, 429, 319; 330/38 M

[56] References Cited

UNITED STATES PATENTS

| | | | |
|---|---|---|---|
| 2,125,982 | 8/1938 | Belleville | 325/375 |
| 3,077,562 | 2/1963 | Key | 325/384 |
| 3,199,029 | 8/1965 | Laurent | 325/387 |
| 3,579,112 | 5/1971 | Harford | 325/319 |

*Primary Examiner*—Albert J. Mayer

*Attorney, Agent, or Firm*—Harold Levine; James Comfort; Gary Honeycutt

[57] ABSTRACT

This application covers a reciver for amplitude modulated radio signals in which all the active elements are embodied in a single integrated circuit. A single tuned circuit is connected to an RF transistor amplifier and includes postive feedback so as to enhance the magnification factor (Q) of the tuned circuit. A detector is responsive to the signal derived from the tune circuit to produce an audio signal and a low frequency transistor amplifier for amplifying the audio signal. The integrated circuit includes all resistors and transistors of the radio within the integrated circuit.

9 Claims, 3 Drawing Figures

TRF RADIO RECEIVER WITH ENHANCED Q AERIAL TUNED CIRCUIT AND FREQUENCY RESPONSE COMPENSATION IN THE LOW FREQUENCY AMPLIFIER

This invention relates to radio receivers and in particular to receivers for amplitude modulated signals.

With the advent of the transistor and the integrated circuit, it has become possible to produce radio receivers inexpensively and of quite small size. However, in order to achieve the selectivity necessary for satisfactory operation in the crowded medium wave band, it has been necessary to incorporate several tuned circuits or to employ a super heterodyne construction in the receiver, thus introducing the bulk and expense of the inductors for the tuned circuits. Moreover, a multiple gang variable capacitor is usually required for tuning.

It is an object of the present invention to provide a radio receiver capable of satisfactory operation employing only a single tuned circuit.

According to the present invention, there is provided a receiver for amplitude modulated radio signals including a single tuned circuit forming an aerial, a radio frequency transistor amplifier connected to the tuned circuit and including positive feedback so as to enhance the magnification factor (Q) of the tuned circuit, a detector responsive to a signal derived from the tuned circuit to produce an audio signal, a low frequency transistor amplifier for amplifying the audio signal, and sound reproducing means connected to an output of the low frequency amplifier, wherein the low frequency amplifier includes filtering means for enhancing the gain of the amplifier for intermediate frequencies in the range of audible frequencies relative to high and low audible frequencies, so as to compensate for attenuation of the intermediate audible frequencies due to the narrow bandwidth of the tuned circuit with the enhanced magnification factor.

It is a particular feature of the embodiment of the invention to be described that all of the active elements are incorporated in a single integrated circuit.

In order that the invention may be fully understood and readily carried into effect, it will now be described with reference to the accompanying drawings, of which:

Figure 1:
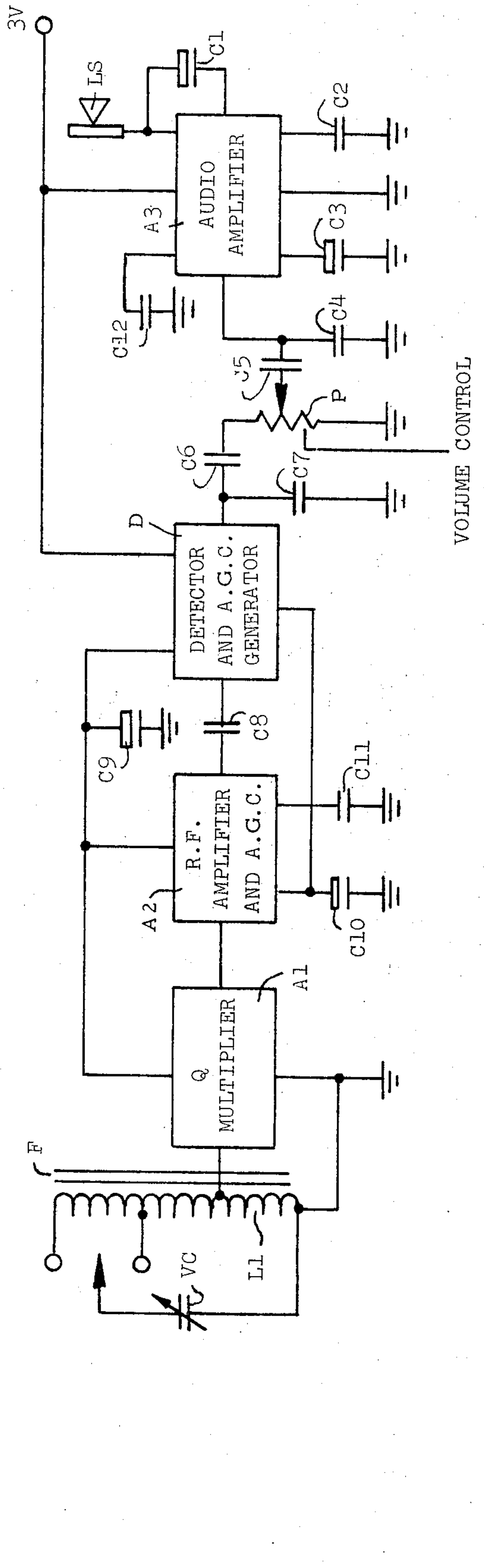
FIG. 1 is a block schematic diagram of a receiver according to an example of the present invention.

Referring to FIG. 1, the receiver has a ferrite rod aerial F on which is wound an aerial coil L1. Associated with the aerial coil L1 is a tuning capacitor VC which is arranged to be connected in parallel with all or part of the coil L1 for tuning in the long or medium wave bands, respectively. Connected to a tapping on the coil L1 is a "Q" multiplier circuit A1, which takes the form of a radio frequency amplifier having positive feedback. The amount of positive feedback is adjusted so that the magnification factor of "Q" of the tuned circuit VC, L1 is enhanced so as to provide adequate attenuation of adjacent channels in the medium wave band, at least for local station reception. It will be appreciated that such enhancement of the magnification factor of the tuned circuit will be sufficient to attenuate severely the frequencies in the central part (e.g., 600Hz to 4KHz) of the audible frequency range relative to low audible frequencies in the signal after detection. The output signal from the "Q" multiplier A1 is applied to a second radio frequency amplifier A2 which incorporates a gain controlled stage regulated by an AGC signal derived from the detector. The amplified signal from the amplifier A2 is applied via a capacitor C8 to a detector and automatic gain control signal generator D from which the AGC signal for the amplifier A2 is derived. The audio signal from the detector D is applied through a capacitor C6 to a volume control potentiometer P, the wiper of which is connected through a capacitor C5 to the input of an audio frequency amplifier A3. A loud speaker LS is connected to the output of the amplifier A3 to reproduce the audio signal. The receiver is powered by a 3 volt supply, such as for example, a two cell battery, and capacitors C1 to C4, C7 and C9 to C12 are provided for the purposes which will become apparent from the description of the detailed circuit given in FIG. 2. In particular, capacitors C4, C5, C6 and C7 are so chosen in relation to the resistance of the potentiometer P, the output impedance of the detector D and the input impedance of the audio amplifier A3 that the middle range of audible frequencies is enhanced relative to the low and high audible frequencies, thereby to compensate for the restriction in bandwidth occasioned by the enhancement of the magnification factor of the tuned circuit VC, L1, so as to produce an adequately flat response over a substantial part of the audible frequency range, that is to say up to about 4KHz.

As a result of the enhancement of the magnification factor of the tuned circuit VC, L1, in conjunction with the filtering effect described above, the receiver provides adequate rejection of adjacent channels in the medium waveband and a tolerable reproduction of the received signal.

Figure 2:
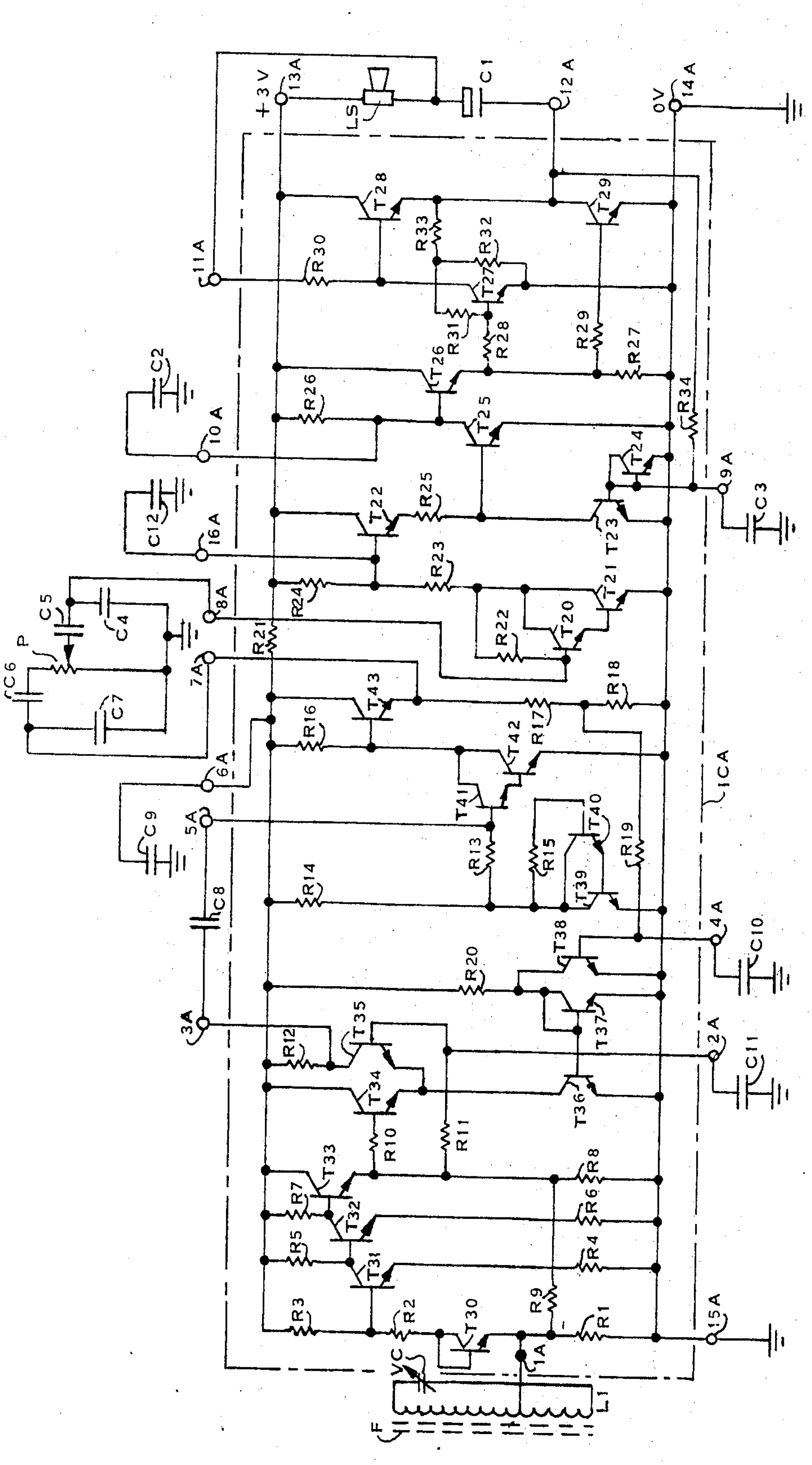
FIG. 2 shows the circuit of the receiver of FIG. 1 in detail.

FIG. 2 shows the circuit of the receiver of FIG. 1, in detail. All of the active elements, that is to say the transistor employed in the circuit, together with all of the fixed resistors are incorporated in a common semiconductor chip to form a single integrated circuit indicated by the chain dotted outline ICA. The tapping on the coil L1 wound on the ferrite rod aerial F is connected to a terminal 1A of the integrated circuit, which terminal is connected to the emitter electrode of a transistor T30. The collector and base electrodes of the transistor T30 are connected together so that this transistor behaves as a diode, which, being connected in a direct current path between supply conductors joined to terminals 13A and 14A of the integrated circuit, is conducting at all times when the receiver is operative. The signal from the coil L1 after passage through the transistor T30 is applied to a transistor amplifier including transistors T31, T32, and T33 connected in cascade. The output from the transistor T33 is derived from its emitter electrode and is applied via a resistor to the emitter of the transistor T30, thereby providing overall positive feedback for the amplifier, the amount of positive feedback being selected so that the amplifier remains stable. The transistors T30 and T33 perform the function of the "Q" multiplier of FIG. 1, by appearing as a negative resistance in parallel with the tuned circuit VC, L1. The transistor T30 stablizes the amplifier against temperature variations, this stabilization being required because there is no overall negative feedback.

The resistor R1 is connected in parallel with the tuned circuit VC, L1 so as to give it a better defined magnification factor, which is multiplied by the "Q" multiplier.

The emitter electrode of the transistor T33 is connected to a radio frequency amplifier formed by transistors T34 and T35 which are coupled together by their emitter electrodes as a long-tailed pair. The base of transistor T35 is decoupled to earth by a capacitor C11 connected to terminal 2A of the integrated circuit. A transistor T36 is connected from the emitters of the transistors T34 and T35 to earth, so that the transistor T36 provides a coupling between the transistors T34 and T35, and in addition a signal applied to the base of transistor T36 controls the gain of the transistors T34 and T36 by regulating their emitter currents. The amplified RF signal is derived from the collector electrode of transistor T35 and is passed through a capacitor C8, connected between terminals 3A and 5A of the integrated circuit to the base electrode of a transistor T41. Transistors T41 and T42 are in Darlington connection and further amplify the radio frequency signal, which is then applied to the base electrode of a transistor T43 which serves to detect or rectify this signal. Transistors T39 and T40 are connected to provide the bias for the base electrode of the transistor T41 in such a way as to compensate for variation of the circuit parameters with temperature. The transistor T43, which acts as a detector for the received radio frequency signal, is arranged to have a very low steady current flow through it under no signal conditions so that rectification takes place on the curvature of the emitter current/base voltage characteristic of the transistor. The rectified output signal is derived from the emitter electrode of the transistor T43 and is applied via the terminal 7A to capacitors C6 and C7 connected in the manner shown and referred to above with reference to FIG. 1. Part of the rectified signal from the emitter electrode of the transistor T43 (derived from potentiometer R17, R18) is fed through a resistor R19 to a reservoir capacitor C10 to generate an automatic gain control signal which is applied through a grounded emitter amplifier transistor T38 to the base electrode of the transistor T36 to control the gain of the RF amplifier formed by the transistors T34 and T35. A transistor T37 having its base and collector electrodes connected together is provided to act as a current mirror for the automatic gain control signal appearing at the collector electrode of the transistor T38.

As in FIG. 1, the rectified signal from detector transistor T43 is passed through the capacitor C6, to the volume control potentiometer P, the wiper of which is connected to a capacitor C5. From C5 the audio frequency signal is applied to terminal 8A of the integrated circuit and thence to the base of the transistor T20 which is in Darlington connection with a transistor T21; these transistors form the input stage of a low frequency amplifier including transistors T20 to T29, and corresponding to the amplifier A3 of FIG. 1. The audio signal from the collectors of transistors T20 and T21 is then amplified by emitter follower transistor T22, grounded emitter transistor T25, and emitter follower transistor T26. The audio signal at the emitter electrode of the transistor T26 takes two paths, one to the base electrode of the transistor T29 through resistor R29 and the other through resistor R28 to grounded emitter transistor T27 and thence to the base of transistor T28. The transistors T28 and T29 are connected in series between the supply conductors connected to terminals 13A and 14A so that the full battery voltage appears across them. The output signal is derived from the collector of transistor T29 and the emitter of transistor T28, and appears at a terminal 12A where it is fed through a capacitor C1 to the loudspeaker LS. A feedback connection is provided from the junction of capacitor C1 and loudspeaker LS to a terminal 11A of the integrated circuit, which terminal is connected through the collector load resistor R30 of transistor T27 to the base electrode of the transistor T28.

Another feedback connection is provided from the terminal 12A of the integrated circuit through a resistor R34 to the base electrodes of the transistors T23 and T24. The emitter-collector path of the transistor T23 is connected in the emitter lead of the transistor T22. The collector and base electrodes of the transistor T24 are connected together so that it behaves as a diode, its emitter electrode being connected to ground. The base electrodes of the transistors T23 and T24 are also connected to a terminal 9A which is connected via a capacitor C3 to ground, so that the feedback is effective for very low frequencies only. This feedback is provided to stabilize the working points of transistors T28 and T29 as described below.

The base of the transistor T22 and the collector of transistor T25 are connected via terminals 16A and 10A of the integrated circuit to capacitors C12 and C2 respectively connected to ground for the purpose of reducing the gain of the audio amplifier with increase in signal frequency above a selected frequency, at 12dB per octave. The supply conductor of the integrated circuit has a decoupling resistor R21 separating the part of the conductor for the audio and radio frequency circuits of the receiver, and the part of the supply conductor for the radio frequency circuits has a terminal 6A which is connected through a decoupling capacitor C9 to earth.

The values of the resistors and capacitors will depend to some extent on the parameters of the transistors forming the integrated circuit, but the selection of these components is made in accordance with normal engineering practice and for clarity in the drawings no values are given. As explained above, with reference to FIG. 1, the values of capacitors C4, C5, C6, and C7, are so chosen that the gain of the low frequency amplifier portion of the receiver, that is to say from the emitter electrode of transistor T43 to the loudspeaker LS through the transistors T20 to T29, varies with signal frequency such as to rise from 600Hz to 4KHz; the gain falls at approximately 12 dB per octave for frequencies above 4KHz as provided by capacitors C12 and C2 connected from the signal path to earth. The output transistors T28 and T29 will limit the voltage swing which can be applied to the loudspeaker LS to the supply voltage less the saturation voltages of T28 and T29 added together. For silicon transistors these saturation voltages are each about 0.3 volts so that in fact only a 2.4 volt swing is possible with a 3 volt supply. In order to ensure that the whole of this voltage swing can be employed to produce undistorted sound, it is necessary that the working points of the transistors T28 and T29 be accurately stabilized so that under no signal conditions the collector of transistor T29 and the emitter of transistor T28 are at half the supply voltage. It is to achieve this stability of the working point that the feedback through resistor R34 from the terminal 12A to the bases of transistors T23 and T24 is provided, the capacitor C3 being provided in shunt with this path to reduce the amount of negative feedback at audio frequencies. Resistors R23 and R24 in the collector lead of Darlington pair T20 and T21 are of equal value, so that the "no signal" voltage level at the emitter electrode of transistor T22 is half the supply voltage, the $2 \times V_{BE}$ from T20, T21 being compensated for by the $V_{BE}$ of T22. The areas of the integrated circuit chip occupied by the emitters of transistors T23 and T24 are chosen to be in the same ratio as the values of resistors R34 and R25, so that the voltage drops across R25 and R34 are equal since T23 and T24 have the same base voltage. Thus transistor T25 receives as base current, in addition to the signal current, a measure of the difference between the voltage at terminal 12A and half the supply voltage (at the emitter of transistor T22). If the output voltage at terminal 12A rises above half the supply voltage, the current from the emitter electrode of transistor T22 increases because of the increased conductivity of transistor T23 and a result of this will be that the conductivity of transistor T25 will be reduced thereby tending to reduce the output voltage of terminal 12A. Conversely if the voltage at terminal 12A falls below half the supply voltage, the transistor T23 becomes less conductive, thereby increasing the conductivity of transistor T25. Thus the voltage level at the terminal 12A is maintained at half the supply voltage.

The values of the resistors R28 and R29, connected from the emitter electrode of transistor T26 to the base electrodes of transistors T27 and T29, respectively, are chosen to be in inverse ratio to the areas of the integrated circuit chip occupied by the emitters of transistors T27 and T29. The base currents of transistors T27 and T29 are in the same ratio as their areas and therefore the voltage drops across resistors R28 and R29 are equal, so that the same voltage is applied to the bases of both transistors T27 and T29. A direct connection from the emitter of transistor T26 to the bases of transistors T27 and T29 cannot be employed because when transistor T27 becomes saturated, its base represents a very low impedance which would interfere with the drive to the output transistor T29.

The circuit described uses only NPN transistors, and enables the current through transistors T29 and T28 to be stablized while allowing the output voltage at the terminal 12A to swing to within the saturation voltages of these transistors of the voltages of the supply conductors. Thus, the circuit is kept stable without the use of additional capacitors or transistors of the opposite conductivity type.

Figure 3:
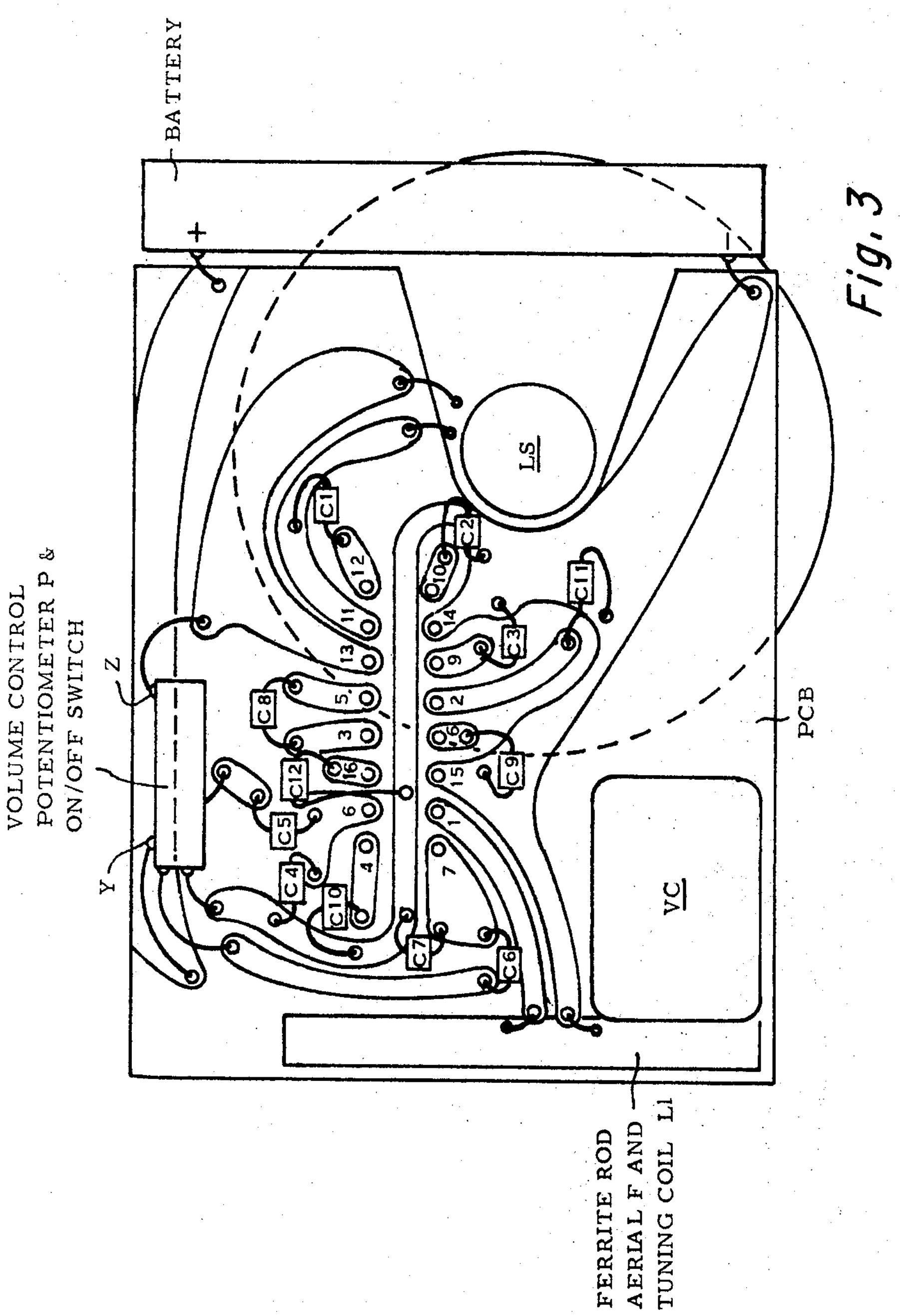
FIG. 3 shows the construction of the receiver of FIGS. 1 and 2.

FIG. 3, is a plan view approximately twice full size of a possible printed circuit board layout for the receiver of FIGS. 1 and 2. In FIG. 3 the ferrite rod aerial and tuning coil, which have the references F and L1 in FIGS. 1 and 2, are shown on the left hand side of the printed circuit board PCB with the tuning capacitor VC next to them. The loudspeaker LS is placed with its magnet within a notch cut into the printed circuit board, and the battery is placed to the right of the board. A standard integrated circuit package (not shown in FIG. 3) having 16 terminals is employed. The numbering of the connections in FIG. 3 corresponds to the terminal numbering of FIG. 2, but without the reference letter A. The capacitors are indicated by their reference numbers in FIG. 3 and the volume control potentiometer P is shown as including an on/off switch the terminals for which are indicated by the references Y and Z.

It will be appreciated that the printed circuit arrangement shown is only one example of a possible design which could be employed.

Many modifications are possible to the embodiment described. For example, the radio frequency amplifier, A2 of FIG. 1, could be connected to the tuned circuit VC, L1 or to some other point of the "Q" multiplier amplifier A1 than its output.

What is claimed is:

1. A receiver for amplitude modulated radio signals including a single narrow bandwidth tuned circuit forming an aerial, a radio frequency transistor amplifier connected to the tuned circuit and including positive feedback so as to enhance the magnification factor (Q) of the tuned circuit, a detector including a transistor as a signal detection means, said detector responsive to a signal derived from the tuned circuit to produce an audio signal, a low frequency transistor amplifier for amplifying the audio signal, and filtering means included in said low-frequency transistor amplifier for determining the frequency response of said low-frequency amplifier such that the gain of the said amplifier is enhanced over middle range frequencies in the range of audio frequencies relative to high and low audio frequencies so as to compensate for attenuation of the middle range audio frequencies due to the narrow bandwidth of the tuned circuit with the enhanced magnification factor.

2. A receiver as set forth in claim 1, further including sound reproducing means connected to an output of said low frequency transistor amplifier.

3. A receiver as set forth in claim 1, further including a second radio frequency transistor amplifier connected to amplify the output signal from the first said radio frequency transistor amplifier connected to enhance the magnification factor of the tuned circuit, said second radio frequency transistor amplifier having its output connected to said detector for applying the amplified output signal from said first radio frequency transistor amplifier thereto.

4. A receiver as set forth in claim 3, wherein said second radio frequency transistor amplifier includes two transistors connected to each other by their emitters in a long-tailed pair circuit with a further transistor having its emitter-collector path connected to the common emitter path of the said two transistors, the further tansistor being connected to receive an automatic gain control signal.

5. A receiver for amplitude modulated radio signals including a single narrow bandwidth tuned circuit forming an aerial, a radio frequency transistor amplifier connected to the tuned circuit and including positive feedback so as to enhance the magnification factor (Q) of the tuned circuit, a detector including a transistor as a signal detection means, said detector responsive to a signal derived from said tuned circuit to produce an audio signal, resistor-capacitor means coupling said detector through a low-frequency transistor amplifier for amplifying said audio signal, and filtering means included in said low-frequency amplifier for enhancing the gain of said amplifier over middle range frequencies in the audio frequency range relative to high and low audio frequencies so as to compensate for attenuation of said middle range audio frequencies due to the narrow bandwidth of said tuned circuit with the enhanced magnification factor, said receiver thereby having a substantially flat frequency response characteristic over a predetermined range of audio frequencies including said middle range frequencies, and said radio frequency amplifier, said detector and said low-frequency amplifier including transistors and fixed value resistors all included as circuit elements of a single integrated circuit.

6. A receiver as set forth in claim 5, further including capacitors coupling said detector to said low frequency transistor amplifier and capacitors shunting the signal path to earth, the frequency response of said low frequency transistor amplifier being determined by the capacitances of said capacitors.

7. A receiver as set forth in claim 6, wherein said low frequency transistor amplifier has a frequency response capable of rising from 600Hz to 4KHz and for frequencies above 4KHz to fall at 12 dB per octave, the rise in the frequency response of said low frequency transistor amplifier being arranged so as to compensate substantially for attenuation of the audio signal between 600Hz and 4KHz due to the narrow bandwidth of the tuned circuit with the enhanced magnification factor.

8. A receiver as set forth in claim 5, wherein said low frequency transistor amplifier comprises a Darlington pair of transistors having a center tapped collector load resistor, an emitter follower transistor having its base electrode connected to the tapping on the load resistor such that the voltage level at the emitter of the emitter follower transistor under "no signal" conditions is half the supply voltage, two output transistors of the same conductivity type connected in series and being connected to said sound reproducing means, and the working point of the two series-connected output transistors being stabilized by dc negative feedback from the junction of the two series-connected output transistors through a feedback resistor to the base electrodes of first and second transistors, the emitter-collector path of the first transistor being conected to form part of the emitter load of said emitter follower transistor, the collector of the second transistor being connected to its base, and the ratio of the areas of the emitters of the first and second transistors being equal to the ratio of the resistance of a resistor forming the remainder of the emitter load of said emitter follower transistor to the resistance of the feedback resistor.

9. A receiver as set forth in claim 8, wherein the base electrode of one of the two series-connected output transistors is connected through a first resistor to the emitter of a second emitter follower transistor, the base electrode of the other of the two series-connected output transistors is driven by a grounded emitter transistor from said second emitter follower transistor, and the base electrode of the grounded emitter transistor is connected to the emitter of said second emitter follower transistor through a second resistor, the resistances of the first and second resistors being in inverse ratio to the areas of the emitters of the transistors to the base electrodes of which said first and second resistors are respectively connected.

* * * * *